(12) United States Patent
Gebara et al.

(10) Patent No.: US 8,063,424 B2
(45) Date of Patent: Nov. 22, 2011

(54) EMBEDDED PHOTODETECTOR APPARATUS IN A 3D CMOS CHIP STACK

(75) Inventors: Fadi H. Gebara, Austin, TX (US); Tak H. Ning, Yorktown Heights, NY (US); Qiqing C. Ouyang, Yorktown Heights, NY (US); Jeremy D. Schaub, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 43 days.

(21) Appl. No.: 12/618,895

(22) Filed: Nov. 16, 2009

(65) Prior Publication Data

US 2011/0115004 A1    May 19, 2011

(51) Int. Cl.
*H01L 31/062* (2006.01)
(52) U.S. Cl. . 257/292; 257/293; 257/462; 257/E25.032; 257/E27.133; 257/E33.076
(58) Field of Classification Search .................. 257/292, 257/293, E27.133, E25.032, 462, E33.076
See application file for complete search history.

(56) References Cited

U.S. PATENT DOCUMENTS

| | | | |
|---|---|---|---|
| 5,525,828 A | 6/1996 | Bassous et al. | |
| 5,757,836 A | 5/1998 | Jiang et al. | |
| 5,994,751 A | 11/1999 | Oppermann | |
| 6,455,344 B1 | 9/2002 | Lee | |
| 6,667,528 B2 | 12/2003 | Cohen et al. | |
| 7,132,656 B2 | 11/2006 | Xu et al. | |
| 7,355,720 B1 | 4/2008 | Carr | |
| 7,501,303 B2 | 3/2009 | Unlu et al. | |
| 7,736,949 B2 * | 6/2010 | Chen et al. | 438/106 |
| 2007/0170476 A1 | 7/2007 | Giziewicz et al. | |
| 2009/0194768 A1 | 8/2009 | Leedy | |

FOREIGN PATENT DOCUMENTS

RU    2 240 631 C1    11/2004
WO    WO 2006008746 A2 *  1/2006

OTHER PUBLICATIONS

Ghioni, Massimo et al., "A VLSI-Compatible High-Speed Silicon Photodetector for Optical Data Link Applications", IEEE Transactions on Electron Devices, vol. 43, No. 7, Jul. 1996.

* cited by examiner

*Primary Examiner* — David Vu
*Assistant Examiner* — Brandon Fox
(74) *Attorney, Agent, or Firm* — Cantor Colburn LLP; Vazken Alexanian

(57) ABSTRACT

An embedded photodetector apparatus for a three-dimensional complementary metal oxide semiconductor (CMOS) stacked chip assembly having a CMOS chip and one or more thinned CMOS layers is provided. At least one of the one or more thinned CMOS layers includes an active photodiode area defined within the one or more thinned CMOS layers, the active photodiode area being receptive of an optical signal incident thereon, and the active photodiode area comprising a bulk substrate portion of the thinned CMOS layer. The bulk substrate portion has a diode photodetector formed therein.

22 Claims, 5 Drawing Sheets

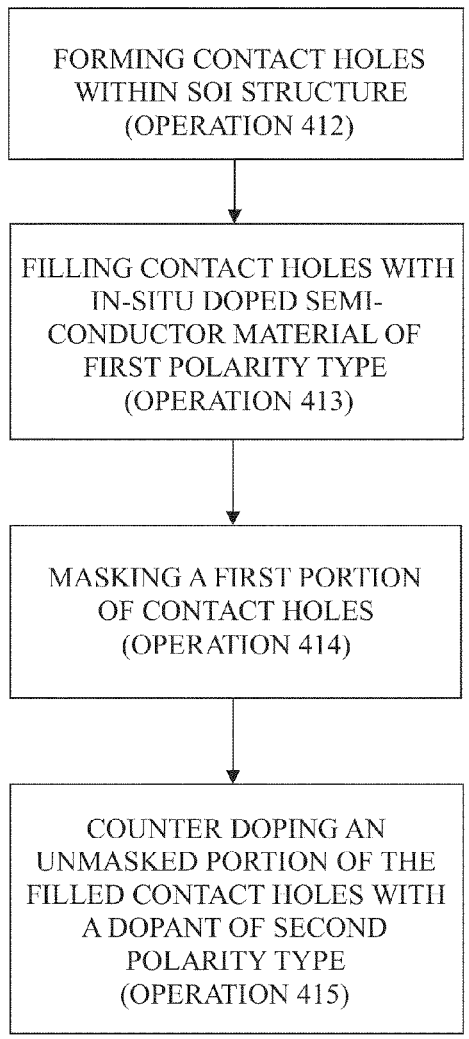
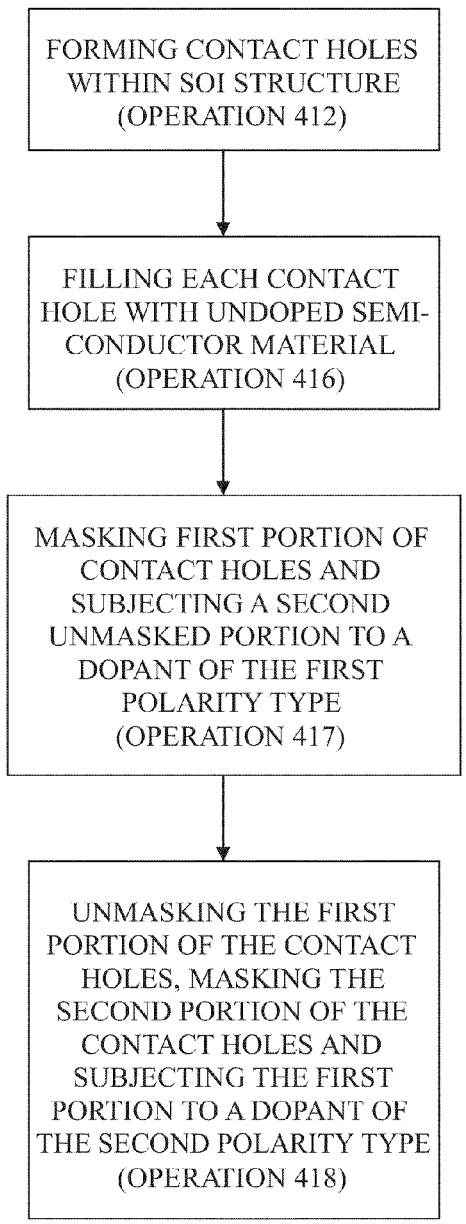
FIG. 5A
FIG. 5B

US 8,063,424 B2

EMBEDDED PHOTODETECTOR APPARATUS IN A 3D CMOS CHIP STACK

BACKGROUND

The present invention relates generally to a photodetector apparatus and, more particularly, to an embedded silicon photodetector structure integratable in a three-dimensional (3D), complementary metal oxide semiconductor (CMOS) process flow.

Highly parallel optical data transceivers are increasingly being used to add more and more bandwidth available for high-end server systems and other similar systems. An enabling technology for such high-density communications is optical waveguide technology, in which a polymer waveguide carries optical signals between modules on a printed circuit board. A bottleneck in this scheme forms as a result of the conversion between the optical signal back to the electrical signal used by the microprocessor.

Typically, a photodetector is a diode, which can be a PN diode, a PIN diode or a Schottky diode consisted of metal on n-type or p-type semiconductor. Most commonly, a photodetector is fabricated using a III-V semiconductor such as GaAs, which needs to be packaged and connected to a silicon chip. As such, a silicon CMOS-based optical receiver has the potential to reduce packaging area, parasitics, power, and cost.

The absorption length of 850 nm light in silicon is 15-20 µm, which is much longer than the 1-2 µm absorption lengths of typical III-V semiconductors at this wavelength. Since CMOS processing is optimized to create thin-film features, high-speed silicon photodetectors are often designed with a lateral, interdigitated structure in which the contacts are fabricated on the silicon surface. Electron-hole pairs photogenerated near the surface of the wafer are quickly collected, but there are significant numbers of carriers generated deep below the surface. These deep carriers encounter a weak electric field and exhibit a long transit time to reach the surface contacts of the device, resulting in a low bandwidth ($<<1$ GHz).

While photodetectors that attempt to block these deep carriers by modifying the standard CMOS process in some fashion exist, they are expensive and difficult to manufacture. On the other hand, high-speed ($>1$ Gb/s) silicon photodetectors fabricated without any changes to the existing CMOS flow exhibit very low efficiency.

SUMMARY

In accordance with an aspect of the invention, an embedded photodetector apparatus for a three-dimensional complementary metal oxide semiconductor (CMOS) stacked chip assembly having a CMOS chip and one or more thinned CMOS layers is provided. At least one of the one or more thinned CMOS layers includes an active photodiode area defined within the one or more thinned CMOS layers, the active photodiode area being receptive of an optical signal incident thereon, and the active photodiode area comprising a bulk substrate portion of the thinned CMOS layer. The bulk substrate portion has a diode photodetector formed therein.

In accordance with an aspect of the invention, an embedded photodetector apparatus for a three-dimensional complementary metal oxide semiconductor (CMOS) stacked chip assembly is provided and includes a package to emit an optical signal with a wavelength of about 850 nm, a heat sink, a CMOS chip coupled to the heat sink and one or more thinned CMOS layers interposed between the CMOS chip and the package. Each of the one or more thinned CMOS layers has a thickness of about 2-15 µm and includes an active photodiode area substrate defined within the one or more thinned CMOS layers, the active photodiode area being receptive of an optical signal incident thereon, a buried oxide (BOX) layer disposed adjacent to the active photodiode area substrate and a silicon-on-insulator (SOI) layer disposed adjacent to the BOX layer and including CMOS components, which are associated with laterally arranged interdigitated p+ and n+ type contacts of a PIN photodetector extending through the BOX layer to the active photodiode area substrate.

In accordance with an aspect of the invention, a method of assembling an embedded photodetector apparatus for a three-dimensional complementary metal oxide semiconductor (CMOS) stacked chip assembly is provided and includes forming one or more thinned CMOS layers, each of which includes an active photodiode area substrate receptive of an optical signal having wavelength of about 850 nm and a silicon-on-insulator (SOI) layer, the substrate, the SOI layer and additional layers having a total thickness of about 2-15 µm, etching contact holes in field regions of the SOI layer of each thinned CMOS layer in which an n+ poly is deposited and doping and counter doping the n+ poly with corresponding changes to block level masks to form n+ and p+ contacts of a PIN photodetector, respectively, extending from the SOI layer of each thinned CMOS layer to the corresponding substrate.

In accordance with yet another aspect of the invention, a method of forming a photodetector device in a complementary metal oxide semiconductor (CMOS), silicon-on-insulator (SOI) structure, the CMOS SOI structure having a bulk substrate portion, a buried oxide (BOX) layer over the bulk substrate portion, and a SOI layer over the BOX layer is provided and includes forming doped contacts of a first polarity type through the BOX layer and into the bulk substrate portion and forming one or more doped contacts of a second polarity type in the bulk substrate portion. The bulk substrate includes an active photodiode area of a PIN photodetector.

BRIEF DESCRIPTIONS OF THE SEVERAL VIEWS OF THE DRAWINGS

The subject matter regarded as the invention is particularly pointed out and distinctly claimed in the claims at the conclusion of the specification. The foregoing and other aspects, features, and advantages of the invention are apparent from the following detailed description taken in conjunction with the accompanying drawings in which:

FIGS. 5A and 5B are flow diagrams illustrating further methods of forming a photodetector apparatus.

DETAILED DESCRIPTION

Disclosed herein is a photodetector structure that may be enabled through stacked wafer (i.e., 3D) complementary-metal-oxide-semiconductor (CMOS) technology for use in short wavelength (~850 nm) data communication applications. The photodetector exhibits a good tradeoff between bandwidth and efficiency while requiring little or no changes to existing 3D CMOS processing flow. A system including the photodetector can be integrated in a relatively straightforward manner with existing optical packaging technology.

In 3D technology, two or more layers of active CMOS circuitry are stacked over one another. For example, a standard "thick" CMOS chip may be connected to a heat sink, while one or more "thinned" CMOS layers are inserted between the thick chip and the package. These thin layers (on the order of a few microns in thickness) include so-called thru-silicon-vias (TSV's) to facilitate the connection between all layers in the stack. In general, the thinned layer can be placed in a 3D chip stack such that the back-end of line (BEOL 80) faces the surface of the thick chip ("face-to-face" orientation), or such that the BEOL faces the surface of the thick chip ("face-to-back" orientation). As illustrated in further detail below, a photodetector may be formed in one or more thinned chips using standard CMOS surface processing. Either the "face-to-face" or "face-to-back" orientation is compatible with a photodetector in the thinned layer, as long as there is an opening in the BEOL 80 above the photodetector such that the light can pass through to the substrate. Because photocarriers are only generated within the thickness of the thinned silicon layer, the slowly moving carriers are largely eliminated. In addition, many photons will make multiple passes through the silicon region due to reflections at the top and bottom silicon surfaces. This will, in turn, serve to increase absorption efficiency while maintaining a high bandwidth.

Figure 1:
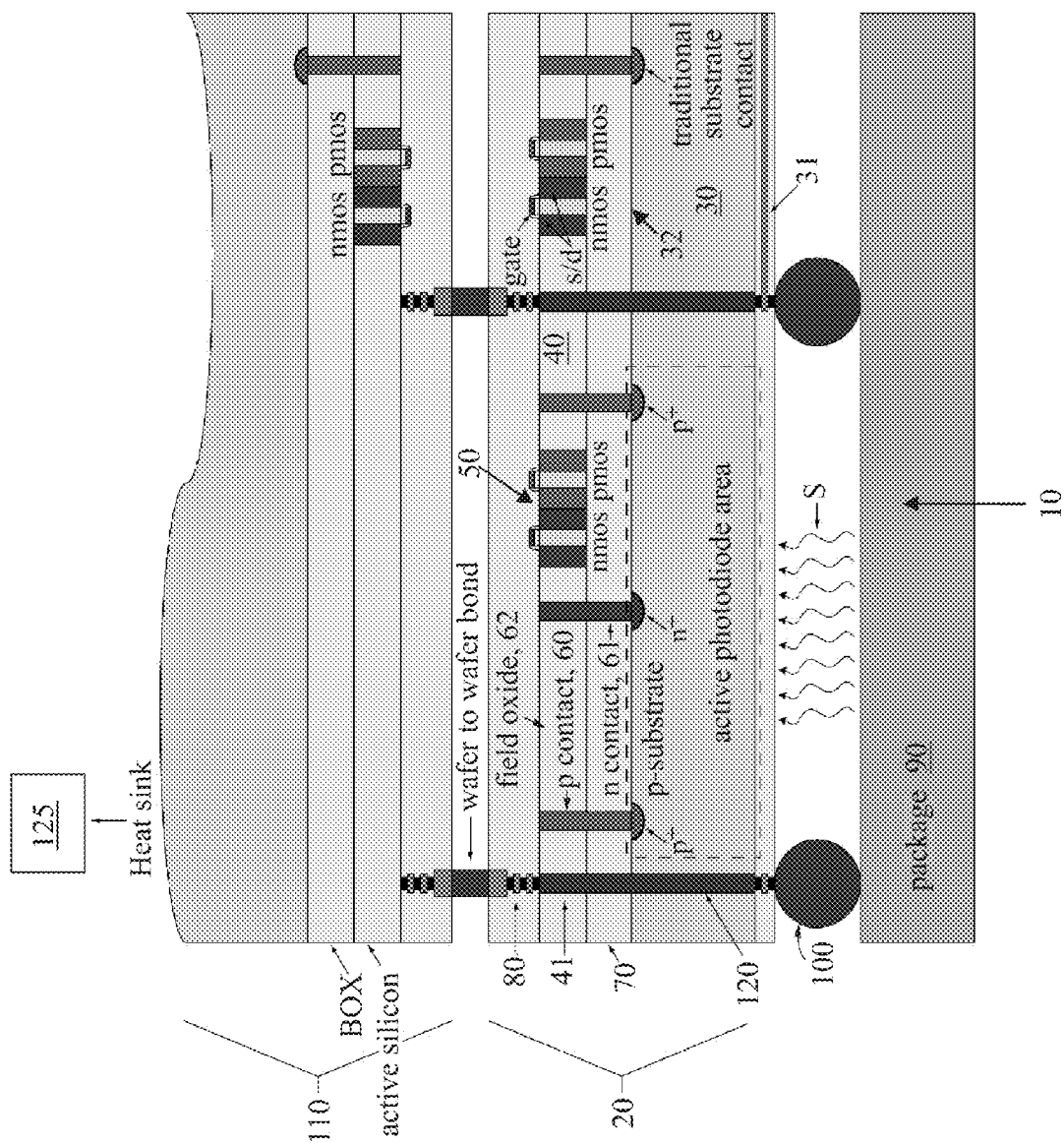
FIG. 1 is a side sectional view of a chip stack of a photodetector apparatus in accordance with embodiments of the invention.

With reference to FIG. 1, a photodetector apparatus 10 is provided and includes one or more stacked thin chips 20, one of which will be described in detail for clarity. The chip 20, in an exemplary embodiment, is a silicon-on-insulator (SOI) structure that includes an active photodiode area defined therein, which corresponds to the bulk substrate portion (hereinafter "substrate") 30 of the SOI structure, having first and second opposing surfaces 31, 32. The bottom of the substrate 30 is receptive of an optical signal S, which may be incident on the first surface 31. As further illustrated in FIG. 1, the thin chip 20 further includes a buried oxide (BOX) layer 70 formed on the substrate 30, and an SOI layer 40 formed on the BOX layer 40. The SOI layer 41 may include various CMOS devices 50 formed therein, such as n-mos and p-mos transistors. One or more field oxide regions 62 may also be formed in the SOI layer 41 so as to provide electrical isolation between devices therein. As will also be recognized, a back-end-of-line (BEOL) region 80 is also shown formed over the SOI layer 41, including one or more wiring levels as known in the art.

In a conventional CMOS process flow using SOI technology, conductive contacts of a p-type polarity 60 would be already be present to form a contact from the SOI layer 41, completely through the BOX layer 71, and into the substrate 30. Accordingly, with relatively few process flow adjustments, the embodiment of FIG. 1 further includes the formation of n+ contacts 61 from the SOI layer 41, completely through the BOX layer 71, and into the substrate 30, in addition to the p+ contacts 60. Thus configured, the p+ contacts 60 and n+ contacts 61 are disposed proximate to the second surface 32 of the substrate 30 and define a lateral P-I-N photodetector.

Figure 2:
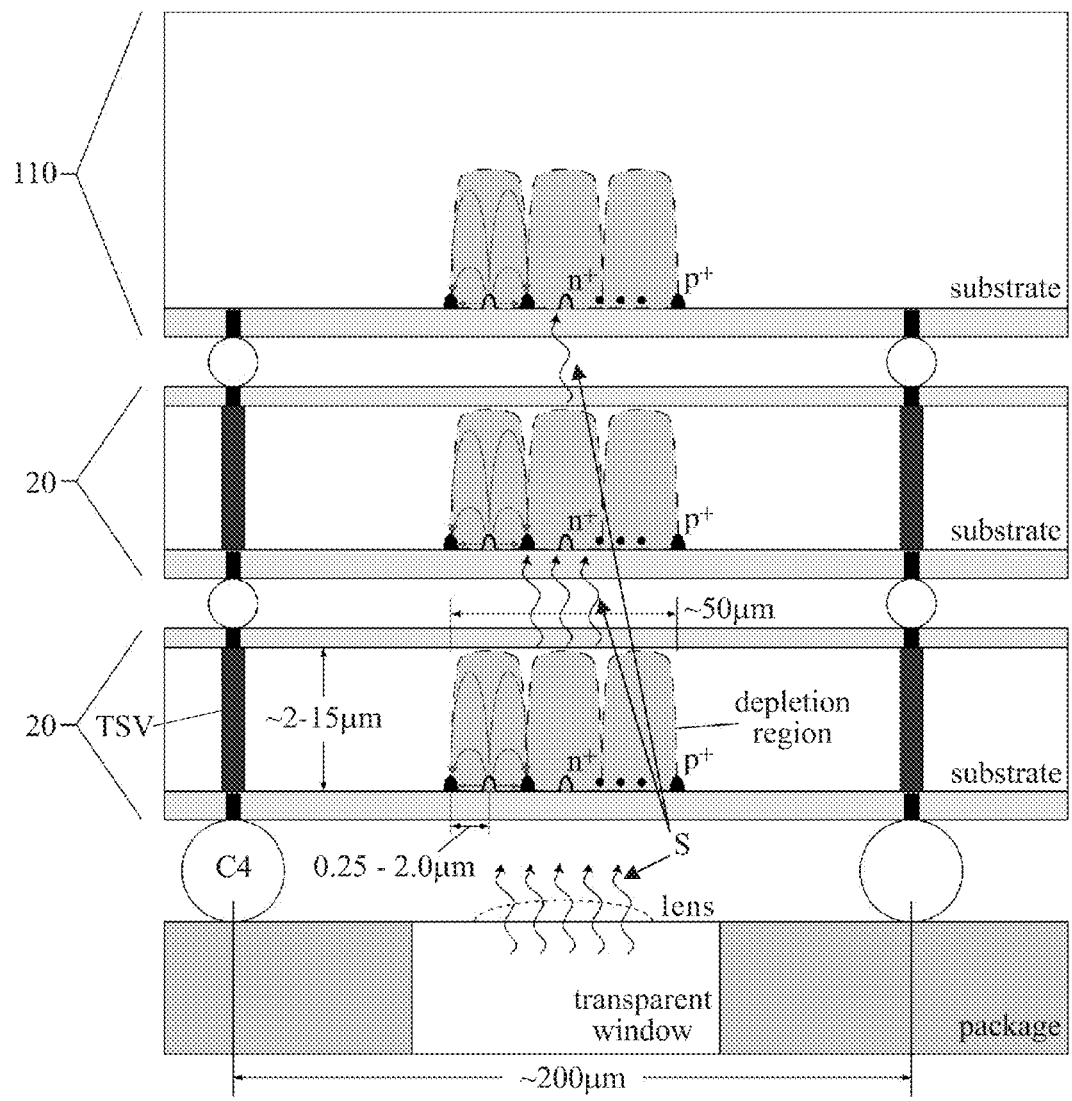
FIG. 2 is a schematic diagram of a chip stack and an optical signal.

In operation, the optical signal S may either be absorbed by the substrate 30 or allowed to penetrate to a next chip 20 in the stack, such as shown for example, in FIG. 2. Absorption leads to the formation of current carriers, such as electron-hole pairs, in the substrate 30 that split in the presence of an electric field with electrons tending to flow towards the p+ contacts 60 and the holes tending to flow towards the n+ contacts 61. Current is thereby generated in accordance with a strength of the optical signal and an absorption efficiency of the substrate 30. FIG. 2 further depicts the one or more stacked chips 20 respectively including substantially similar structures, as described above, and each of the one or more stacked chips 20 may have an exemplary vertical thickness of about 2-15 μm and an absorption window for the optical signal having an exemplary lateral width of about 50 μm.

The electric field should be near a saturation point (e.g., 1-4V/μm) achieved at or near the first surface 31 with a finger spacing of about 1-0.25 μm for standard supply voltages near 1V. The fringing electric field recessed from the first surface 31 may decrease, however, so a separate, higher voltage supply might be desired for relatively high bandwidth communication applications. For a vertical photodiode (described in further detail below), the electric field will depend upon the supply voltage, the thickness of the chip 20 and the depth of the lead 130.

Referring again to FIG. 1, the photodetector apparatus 10 may include a package 90, such as an optical signal emitting device, to emit the optical signal S toward the substrate 30. The optical signal S may be routed across a printed circuit board (PCB) using, for example, waveguides, a 45 degree mirror etched with laser ablation to reflect light, and transparent windows with or without lenses for focusing light. In alternative embodiments, multimode optical fibers may be employed to transport signals between packages, fiber ribbon cables may be used as a connection for an optical connector, a connector to couple light to a waveguide, which is routed between controlled collapse chip connection (C4) joints to the substrate 30 and a 45 degree mirror etched with laser ablation may be employed to reflect light.

The one or more stacked chips 20 may be mounted on the package 90 by, e.g., C4 solder joints 100. Here, the photodetector apparatus 10 may further include a relatively thick CMOS chip 110 and a plurality of through silicon vias (TSVs) 120 by which at least the one or more stacked chips 20, the CMOS chip 110 and the package 90 are connectable to and communicable with one another. The CMOS chip 110 may be coupled to a heat sink 125 by which heat can be removed from the photodetector apparatus 10.

Referring to FIG. 1 and again to FIG. 2, in accordance with embodiments of the invention, the one or more stacked chips 20 may be stacked vertically along a direction defined to be substantially in parallel with a propagation direction of the optical signal S. Here, each of the one or more stacked chips 20 respectively includes substantially similar structures, as described above, and each of the one or more stacked chips 20 may have a vertical thickness of about 2-15 μm and an absorption window for the optical signal having a lateral width of about 50 μm.

With this configuration, where the optical signal S has a wavelength of about 850 nm, a portion of the optical signal S will penetrate the bottom chip 20 in the stack and propagate to the next lowest chip 20. A further portion will penetrate that chip 20 and propagate to the next and so on. With enough stacked thin chips 20, however, the optical signal S may be fully or nearly fully absorbed even though each individual chip 20 may be relatively thin and therefore incapable of absorbing the entire optical signal S on its own. In this way, with the optical signal S fully or nearly fully absorbed, a magnitude of generated current can be correspondingly relatively large. Moreover, since current carriers in each chip 20 are produced without substantial reliance upon deep carriers, the current generation can be achieved relatively quickly and efficiently.

As indicated above, for the lateral photodetector embodiment of FIG. 1, both p+ and n+ contacts 60, 61 are created so as to extend through the BOX layer 70 to the second surface 32. Since the p+ contacts 60 would, in most cases, already be present in the process flow, it is possible depending on the type of CMOS employed, that n+ contacts 61 can be realized with relatively little or no process modification.

For example, a conventional partially-depleted SOI (PD-SOI) with a thick BOX and a p− substrate normally includes substrate contacts containing 1000-2500 nm thick p+ polysilicon. These contacts are formed by the etching of contact holes in field regions (STI regions), the depositing of undoped polysilicon, chemical mechanical polishing (CMP), and the doping of the polysilicon with p+ implants for formation of pFET sources/drains. Typically, the dopants are driven in and activated by RTA (rapid thermal anneal).

In contrast, to form the p+ and n+ contacts 60, 61, an n+ poly ($<1\times10^{20}$ cm$^3$ doping concentration) can be deposited in situ and then doped n+/p+($>1\times10^{20}$) during nFET/pFET S/D implant with minor design changes in the block masks. For the p+ contacts 60, the original n+ poly will be counter doped, for example, by boron, due to its relatively good diffusivity in poly and silicon.

As for other embodiments, such as ultra-thin SOI (UTSOI) or extremely-thin SOI (ETSOI), multi-gate (finfet or trigate), gate wrap around devices (nanowire, C nanotubes) or graphine MOSFETs with thin BOX, the total thickness of the substrate contacts would be in the range of about 10 nm to about 100 nm. The photodiodes can be formed the same way as the substrate contacts and need no change in the process, i.e., deposition of undoped poly and later doped n+/p+ contacts through n+/p+S/D implant with minor design changes in block level masks.

Figure 3:
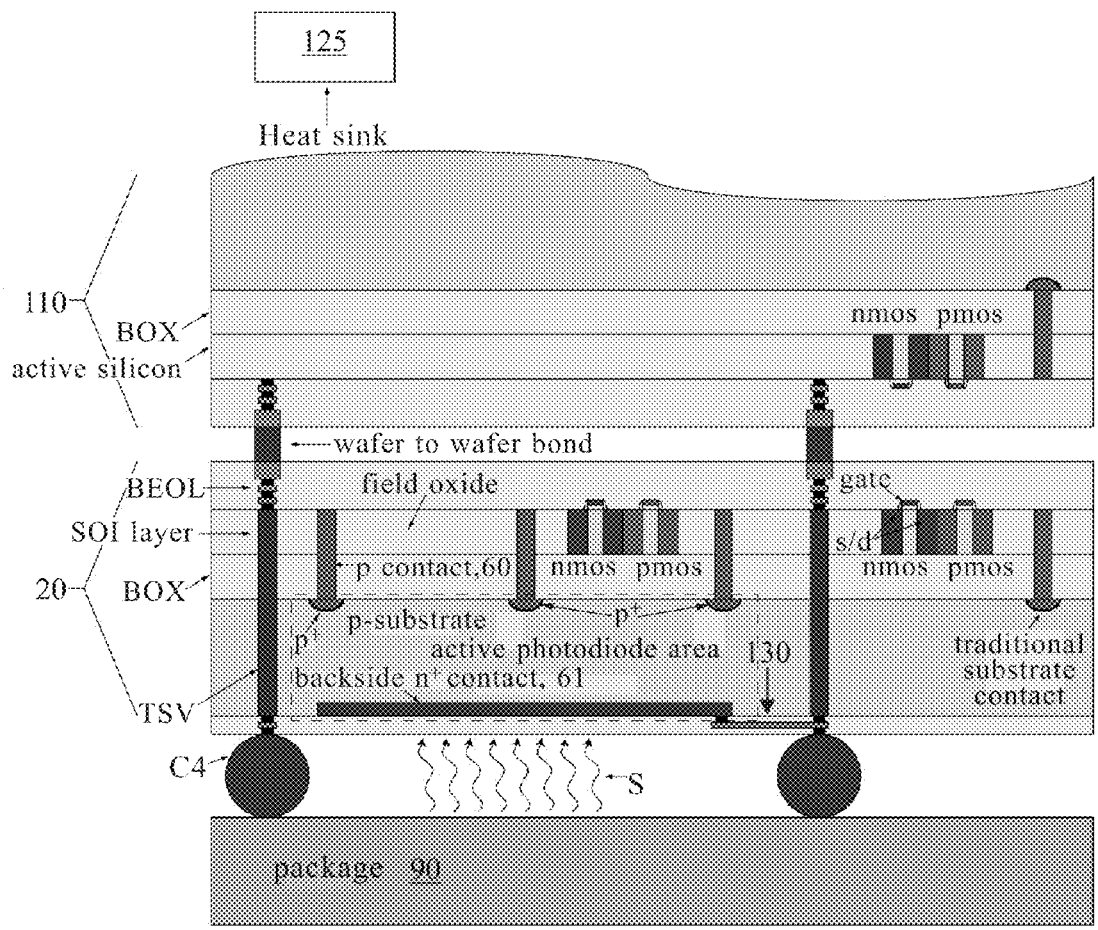
FIG. 3 is a side sectional view of a chip stack of a photodetector apparatus in accordance with further embodiments of the invention.

Referring to FIG. 3 and, in accordance with further embodiments of the invention, the p+ and n+ contacts 60, 61 may be vertically arranged with respect to one another. In contrast to FIG. 1, all of the contacts formed through the SOI layer 41 (i.e., proximate the second surface 32) are doped with the p+ material. In addition, a backside n+ contact 61 is disposed proximate to the first surface 31 of the substrate 30. Here, a CMOS component lead 130 would be coupled to at least one of the CMOS components 50 and the backside n+ contact 61. This vertical photodetector can be realized through additional processing of a backside of the chip 20 and has a structure that may provide for a uniform electric field and relatively efficient carrier transport for a given supply voltage.

A particular exemplary application for a photodetector apparatus 10 as described above is its potential for use in global clock distribution, where a high speed clock signal must be distributed across all layers at various locations across the chip. Distributing this global clock optically would offer many advantages, such as low skew across the chip due to speed of light transmission and lower power operation since many buffers would be eliminated. The clock could be generated off-chip, thus eliminating the need for phase-locked loop circuitry and many TSVs could be used to increase signal density between the layers, since they would not be needed to distribute the clock.

Figure 4:
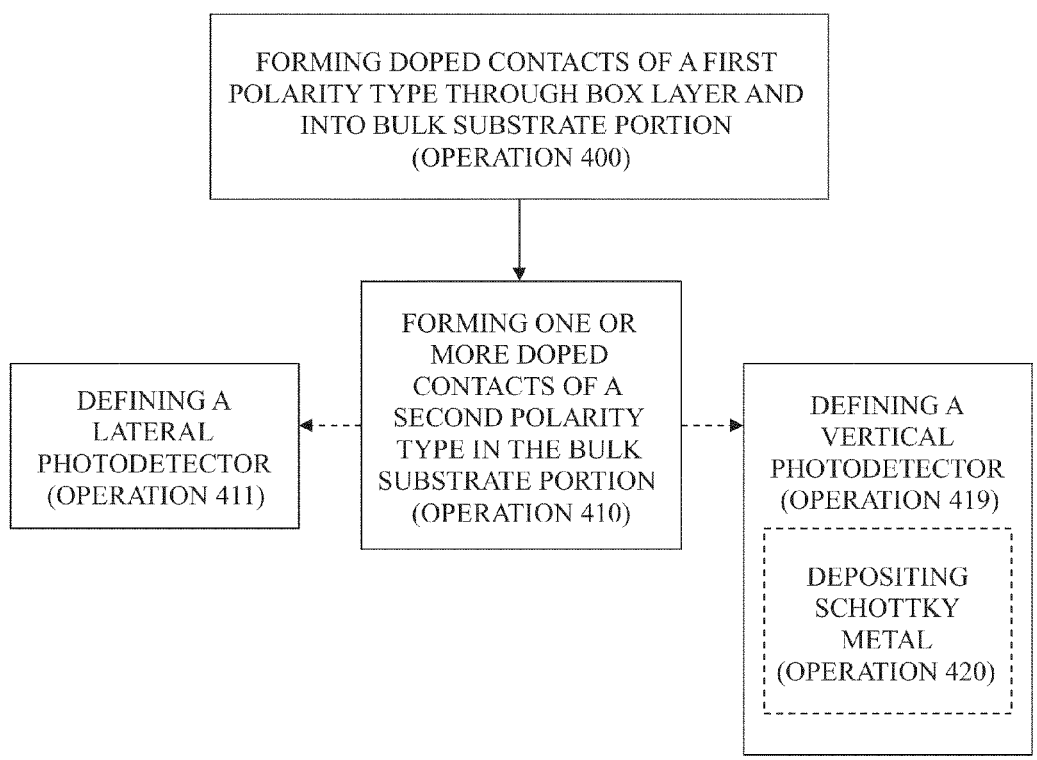
FIG. 4 is a flow diagram illustrating methods of forming a photodetector apparatus in accordance with embodiments of the invention.

With reference to FIGS. 4, 5A and 5B, a method of forming a photodetector device in a complementary metal oxide semiconductor (CMOS), silicon-on-insulator (SOI) structure, the CMOS SOI structure having a bulk substrate portion, a buried oxide (BOX) layer over the bulk substrate portion, and a SOI layer over the BOX layer is provided. The method includes forming doped contacts of a first polarity type through the BOX layer and into the bulk substrate portion (operation 400) and forming one or more doped contacts of a second polarity type in the bulk substrate portion, wherein the bulk substrate includes an active photodiode area of a P-I-N photodetector (operation 410).

The one or more doped contacts of the second polarity type may also be formed through the BOX layer and into the bulk substrate portion to define a lateral photodetector device (operation 411). Here, the doped contacts of the first and second polarity type may be formed in various manners. In one case, as shown in FIG. 5A, the doped contacts are formed by forming contact holes within the SOI structure (operation 412), filling each of the contact holes with in-situ doped semiconductor material of the first polarity type (operation 413), masking a first portion of the contact holes filled with the in-situ doped semiconductor material of the first polarity type (operation 414) and counter doping an unmasked second portion of the filled contact holes with a dopant of the second polarity type (operation 415).

In another case, as shown in FIG. 5B, the doped contacts of the first and second polarity type are formed by forming contact holes within the SOI structure (operation 412), filling each of the contact holes with undoped semiconductor material (operation 416), masking a first portion of the filled contact holes and subjecting a second unmasked portion of the filled contact holes to a dopant of the first polarity type (operation 417) and unmasking the first portion of the filled contact holes, masking the second portion of the filled contact holes, and subjecting the first portion of the filled contact holes to a dopant of the second polarity type (operation 418).

In accordance with an alternate embodiment, the one or more doped contacts of the second polarity type may includes a backside contact disposed adjacent an opposite surface of the bulk substrate portion with respect to the doped contacts of the first polarity type and into the bulk substrate portion to define a vertical photodetector device (operation 419).

While the disclosure has been described with reference to exemplary embodiments, it will be understood by those skilled in the art that various changes may be made and equivalents may be substituted for elements thereof without departing from the scope of the disclosure. In addition, many modifications may be made to adapt a particular situation or material to the teachings of the disclosure without departing from the essential scope thereof. Therefore, it is intended that the disclosure not be limited to the particular exemplary embodiment disclosed as the best mode contemplated for carrying out this disclosure, but that the disclosure will include all embodiments falling within the scope of the appended claims.

What is claimed is:

1. An embedded photodetector apparatus for a three-dimensional complementary metal oxide semiconductor (CMOS) stacked chip assembly having a CMOS chip and one or more thinned CMOS layers, with at least one of the one or more thinned CMOS layers comprising:
   an active photodiode area defined within the one or more thinned CMOS layers, the active photodiode area being receptive of an optical signal incident thereon, and
   the active photodiode area comprising a bulk substrate portion of the thinned CMOS layer, wherein the bulk substrate portion has a diode photodetector formed therein.

2. The photodetector apparatus according to claim 1, wherein the at least one of the one or more thinned CMOS layers comprises a silicon-on-insulator (SOI) structure CMOS layer.

3. The photodetector apparatus according to claim 2, wherein p+ and n+ type contacts of a P-I-N photodetector are formed through a buried oxide (BOX) layer of the SOI structure in an interdigitated fashion so as to form a lateral photodiode arrangement.

4. The photodetector apparatus according to claim 3, wherein the p+ and n+ contacts are disposed proximate to a same surface of the bulk substrate portion.

5. The photodetector apparatus according to claim 2, wherein one of p+ or n+ type contacts of a P-I-N photodetector are formed through a buried oxide (BOX) layer of the SOI structure and the other type of the p+ or n+ type contacts is formed on a backside of the active photodiode area, opposite the BOX layer, so as to form a vertical photodiode arrangement.

6. The photodetector apparatus according to claim 5, wherein the p+ and n+ contacts are respectively disposed proximate to opposing surfaces of the bulk substrate portion.

7. The photodetector apparatus according to claim 6, further comprising a CMOS component lead coupled to one type of the contacts.

8. The photodetector apparatus according to claim 2, further comprising a back end of line (BEOL) layer disposed adjacent to the SOI layer.

9. The photodetector apparatus according to claim 1, further comprising a package to emit the optical signal and on which the stacked chip assembly is mounted.

10. The photodetector apparatus according to claim 9, wherein the stacked chip assembly is mounted on the package by controlled collapse chip connection (C4) joints.

11. The photodetector apparatus according to claim 9, further comprising a through silicon via (TSV) by which connections of the stacked chip assembly are achieved.

12. The photodetector apparatus according to claim 11, further comprising a heat sink to which the CMOS chip is coupled.

13. The photodetector apparatus according to claim 1, wherein the stacked chip assembly is oriented substantially vertically along a propagation direction of the optical signal.

14. The photodetector apparatus according to claim 13, wherein each of the one or more thinned CMOS layers respectively comprises substantially similar structures.

15. The photodetector apparatus according to claim 13, wherein each of the one or more thinned CMOS layers has a vertical thickness of about 2-15 μm and an absorption window for the optical signal having a lateral width of about 50 μm.

16. The photodetector apparatus according to claim 15, wherein the optical signal has a wavelength of 850 nm.

17. An embedded photodetector apparatus for a three-dimensional complementary metal oxide semiconductor (CMOS) stacked chip assembly, including a package to emit an optical signal with a wavelength of about 850 nm, a heat sink, a CMOS chip coupled to the heat sink and one or more thinned CMOS layers interposed between the CMOS chip and the package, with at least one of the one or more thinned CMOS layers having a thickness of about 2-15 μm and comprising:
   an active photodiode area substrate defined within the one or more thinned CMOS layers, the active photodiode area being receptive of an optical signal incident thereon;
   a buried oxide (BOX) layer disposed adjacent to the active photodiode area substrate; and
   a silicon-on-insulator (SOI) layer disposed adjacent to the BOX layer and including CMOS components, which are associated with laterally arranged interdigitated p+ and n+ type contacts of a P-I-N photodetector extending through the BOX layer to the active photodiode area substrate.

18. A method of forming a photodetector device in a complementary metal oxide semiconductor (CMOS), silicon-on-insulator (SOI) structure, the CMOS SOI structure having a bulk substrate portion, a buried oxide (BOX) layer over the bulk substrate portion, and a SOI layer over the BOX layer, the method comprising:
   forming doped contacts of a first polarity type through the BOX layer and into the bulk substrate portion; and
   forming one or more doped contacts of a second polarity type in the bulk substrate portion, wherein the bulk substrate includes an active photodiode area of a P-I-N photodetector.

19. The method according to claim 18, wherein the one or more doped contacts of the second polarity type are also formed through the BOX layer and into the bulk substrate portion to define a lateral photodetector device.

20. The method according to claim 19, wherein the doped contacts of the first and second polarity type are formed by:
   forming contact holes within the SOI structure;
   filling each of the contact holes with in-situ doped semiconductor material of the first polarity type;
   masking a first portion of the contact holes filled with the in-situ doped semiconductor material of the first polarity type; and
   counter doping an unmasked second portion of the filled contact holes with a dopant of the second polarity type.

21. The method according to claim 19, wherein the doped contacts of the first and second polarity type are formed by:
   forming contact holes within the SOI structure;
   filling each of the contact holes with undoped semiconductor material;
   masking a first portion of the filled contact holes and subjecting a second unmasked portion of the filled contact holes to a dopant of the first polarity type; and
   unmasking the first portion of the filled contact holes, masking the second portion of the filled contact holes, and subjecting the first portion of the filled contact holes to a dopant of the second polarity type.

22. The method according to claim 18, wherein the one or more doped contacts of the second polarity type comprises a backside contact disposed adjacent an opposite surface of the bulk substrate portion with respect to the doped contacts of the first polarity type and into the bulk substrate portion to define a vertical photodetector device.

* * * * *